(12) United States Patent
Imoto

(10) Patent No.: US 7,878,665 B2
(45) Date of Patent: Feb. 1, 2011

(54) HOLDING APPARATUS FOR HOLDING OPTICAL ELEMENT ABOVE A BASE, EXPOSURE APPARATUS INCLUDING THE HOLDING APPARATUS, AND DEVICE MANUFACTURING METHOD USING THE EXPOSURE APPARATUS

(75) Inventor: Kouhei Imoto, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 417 days.

(21) Appl. No.: 12/032,758

(22) Filed: Feb. 18, 2008

(65) Prior Publication Data

US 2008/0204674 A1 Aug. 28, 2008

(30) Foreign Application Priority Data

Feb. 23, 2007 (JP) .............................. 2007-044006

(51) Int. Cl.
*G03B 21/14* (2006.01)
(52) U.S. Cl. ......................................... 353/100; 353/53
(58) Field of Classification Search ................. 353/100, 353/53
See application file for complete search history.

(56) References Cited

U.S. PATENT DOCUMENTS

| 6,870,632 | B2 | 3/2005 | Petasch |
| 7,161,750 | B2 | 1/2007 | Takabayashi |
| 7,218,462 | B2 | 5/2007 | Sudoh |
| 7,236,230 | B2 | 6/2007 | Miyajima |
| 7,253,975 | B2 | 8/2007 | Takabayashi |
| 2002/0163741 | A1 | 11/2002 | Shibazaki |
| 2005/0078386 | A1 | 4/2005 | Takabayashi |
| 2006/0066963 | A1 | 3/2006 | Sudoh |
| 2007/0091275 | A1* | 4/2007 | Hara et al. .................... 353/52 |

FOREIGN PATENT DOCUMENTS

| DE | 102004018656 A1 | 11/2005 |
| EP | 1503246 A2 | 2/2005 |
| JP | 2002-350699 A | 12/2002 |
| JP | 2004-078209 A | 3/2004 |
| JP | 2004-327529 A | 11/2004 |
| JP | 2006-100315 A | 4/2006 |
| KR | 10-2005-0033621 A | 4/2005 |
| WO | 2005/101131 A | 10/2005 |
| WO | 2006/000352 A | 1/2006 |

* cited by examiner

*Primary Examiner*—Seung C Sohn
(74) *Attorney, Agent, or Firm*—Canon U.S.A., Inc. I.P. Division

(57) ABSTRACT

A holding apparatus adapted to hold an optical element above a base includes at least two held members provided at different positions on an outer periphery of the optical element; and holding members provided above the base for respective held members, the holding members being supported above the base by flexure members. Each held member is held by the corresponding holding member in a kinematic coupling.

9 Claims, 17 Drawing Sheets

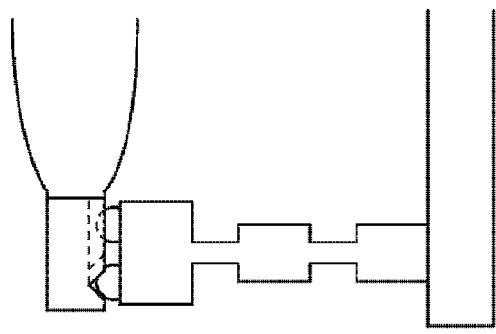
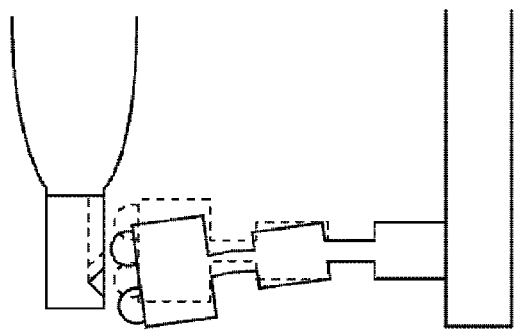
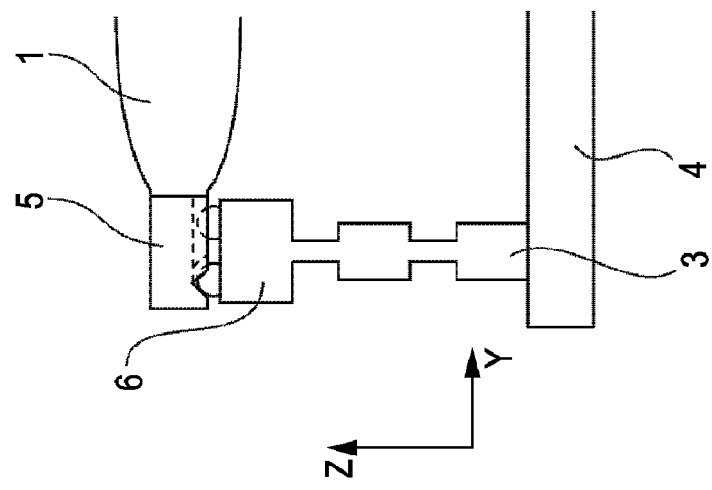

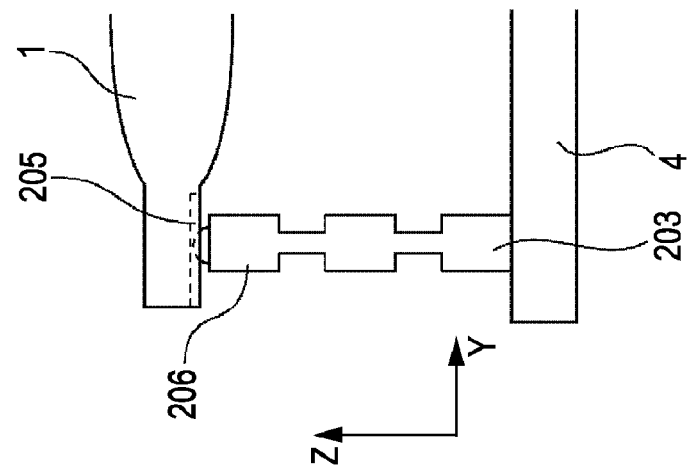
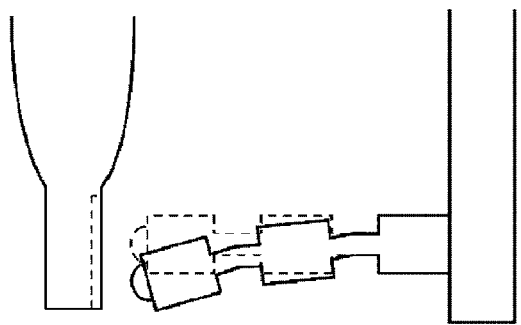
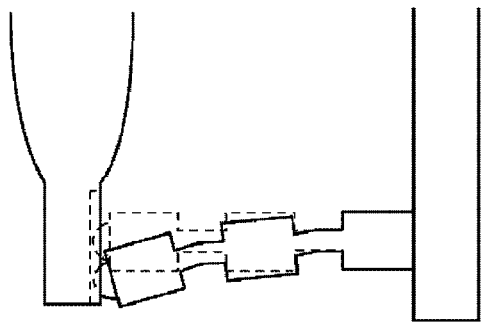

HOLDING APPARATUS FOR HOLDING OPTICAL ELEMENT ABOVE A BASE, EXPOSURE APPARATUS INCLUDING THE HOLDING APPARATUS, AND DEVICE MANUFACTURING METHOD USING THE EXPOSURE APPARATUS

BACKGROUND OF THE INVENTION

1. Field of the Invention

The present invention relates to apparatus for holding objects and, more particularly, to an apparatus for holding an optical element in an exposure apparatus.

2. Description of the Related Art

Projection exposure apparatuses are generally used to transfer a circuit pattern formed on a reticle (or a mask) onto a wafer or the like using a projection optical system in a manufacturing process for a semiconductor device, such as a semiconductor memory or a logic circuit, using photolithography.

The projection optical system includes optical elements, such as a mirror and a lens, which must be held with high accuracy.

FIG. 21 shows a holding apparatus described in Japanese Patent Laid-Open No. 2004-078209. Referring to FIG. 21, a holding apparatus 200A includes three holding units disposed at three positions along the outer periphery of an optical element 210A. Each of the holding units includes a held member 212A disposed on the outer periphery of the optical element 210A and a holding member 220A. The held member 212A has a V-shaped projection and the holding member 220A includes two spherical elements 222A and 224A. The held member 212A is held by the holding member 220A such that surfaces of the projection are in contact with the respective spherical elements. Thus, the optical element is held such that each of the holding units has two contact points. Therefore, the position of the optical element is regulated in two axial directions for each holding member 220A. Since three holding members are disposed at three positions, the position of the optical element 210A is regulated in six axial directions by the holding apparatus 200A as a whole. In other words, the optical element 210A is kinematically supported. In addition, the holding apparatus 200A includes parallel leaf springs 220 movable in a radial direction of the optical element 210A. Accordingly, even when the ambient temperature around the optical element 210A varies, the holding apparatus 200A allows thermal expansion of the optical element 210A while preventing the center O of the optical element 210A from being displaced from a light axis.

The repeatability of the surface shape of the optical element is an important factor for reducing aberrations in an optical system in which the optical element held by the holding apparatus is installed.

For example, the optical element is removed as necessary from the holding apparatus for cleaning or maintenance for damage, and then is reattached to the holding apparatus. It is known that the surface shape of the reattached optical element differs from the original surface shape.

In the structure of the above-mentioned Japanese Patent Laid-Open No. 2004-078209 in which the optical element is held by flexure members, such as leaf springs or elastic hinges, the surface shape of the optical element changes each time the optical element is removed and reattached.

In general, the flexure members have small manufacturing errors. Therefore, the flexure members hold the respective projections in such a state that the flexure members themselves are bent. When the optical element 210A is removed and then reattached, since the position of each projection is regulated only in two axial directions with respect to the corresponding holding member 220A, the relative position between the projection and the holding member 220A changes from the original relative position in axial directions other than the above-mentioned two axial directions. If the relative position between each projection and the corresponding holding member 220A changes when the optical element 210 is reattached, the manner in which each flexure member is bent also changes. As a result, force applied to the optical element 210A as the reactive force to the bending force also changes. Since this force serves to deform the optical element 210A, the surface shape of the optical element 210A changes in accordance with the change in the force.

SUMMARY OF THE INVENTION

The present invention is directed to a holding apparatus which holds an optical element with a flexure member and which reduces changes in the surface shape of the optical element caused when the optical element is removed and reattached.

According to an aspect of the present invention, a holding apparatus adapted to hold an optical element above a base includes at least two held members provided at different positions on an outer periphery of the optical element; and holding members corresponding respectively to the held members, the holding members being supported above the base by flexure members. Each held member is held by the corresponding holding member in a kinematic coupling.

Further features of the present invention will become apparent from the following description of exemplary embodiments with reference to the attached drawings.

BRIEF DESCRIPTION OF THE DRAWINGS

FIGS. 4A, 4B, and 4C illustrate the position repeatability obtained by the kinematic coupling.

FIGS. 6A, 6B, and 6C illustrate the position repeatability obtained by a single ball and a groove.

DESCRIPTION OF THE EMBODIMENTS

First Embodiment

Figure 1:
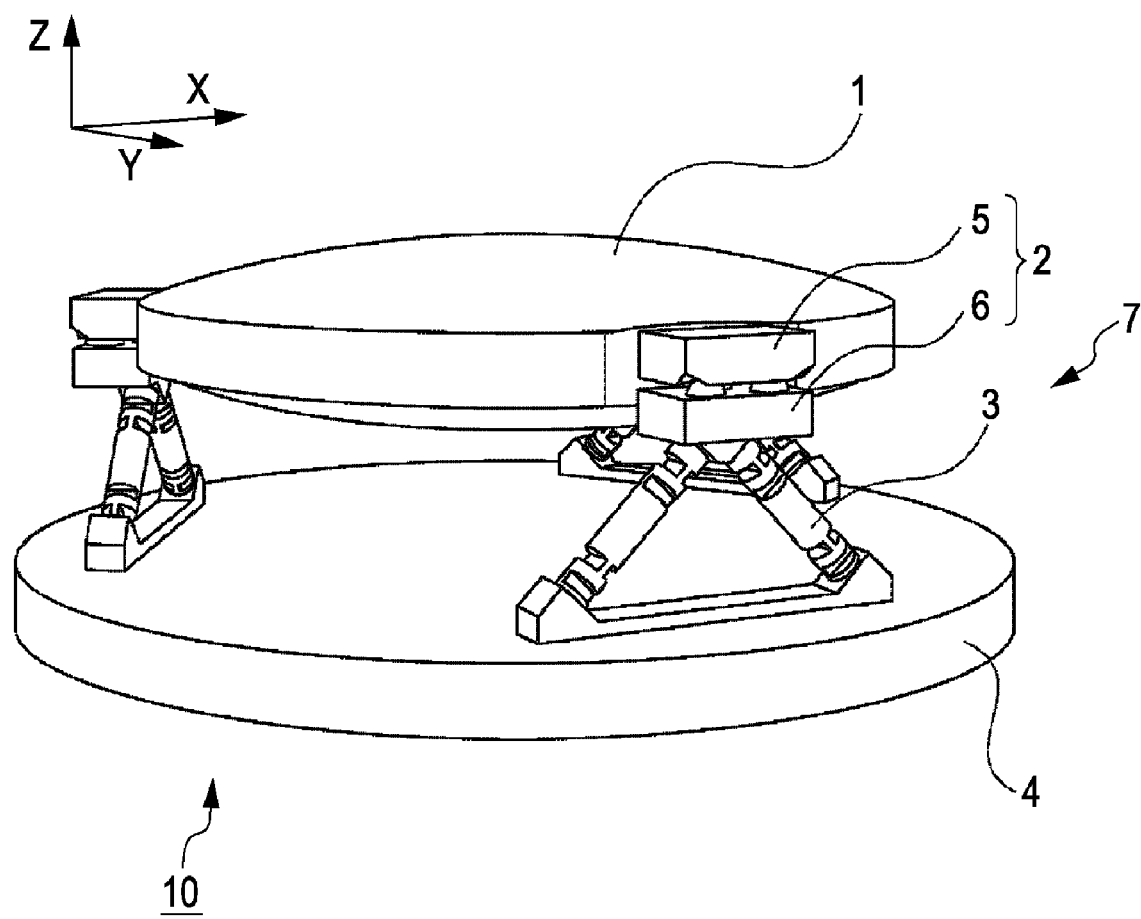
FIG. 1 is a perspective view of an optical-element holding apparatus according to a first embodiment.
Figure 2A:
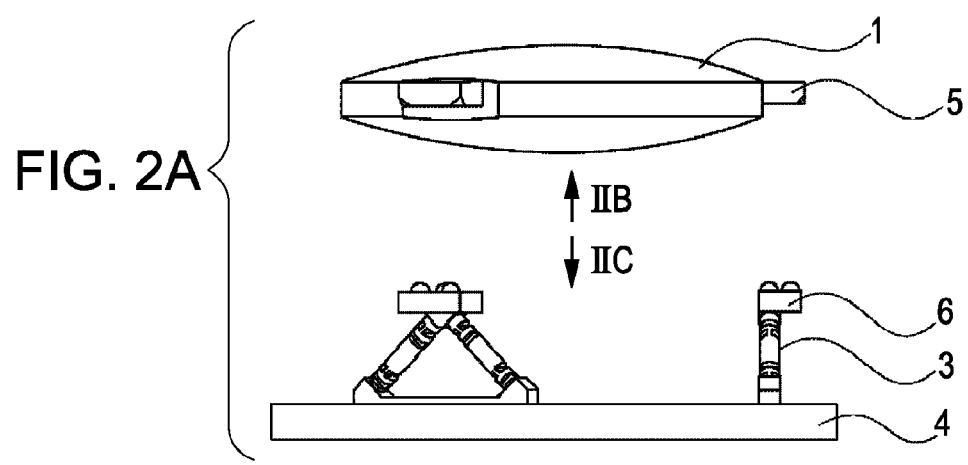
FIG. 2A is a side view of the optical-element holding apparatus according to the first embodiment.
Figure 2B:
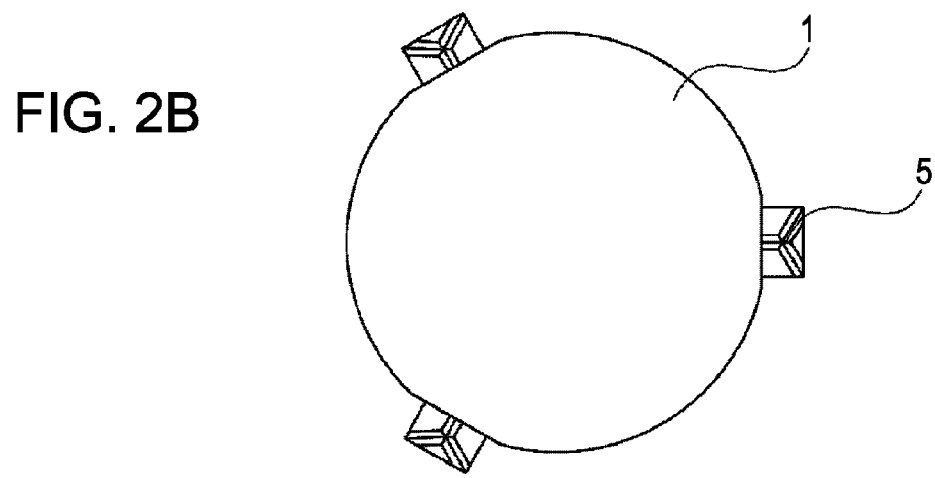
FIGS. 2B and 2C are plan views of the optical-element holding apparatus according to the first embodiment.
Figure 2C:
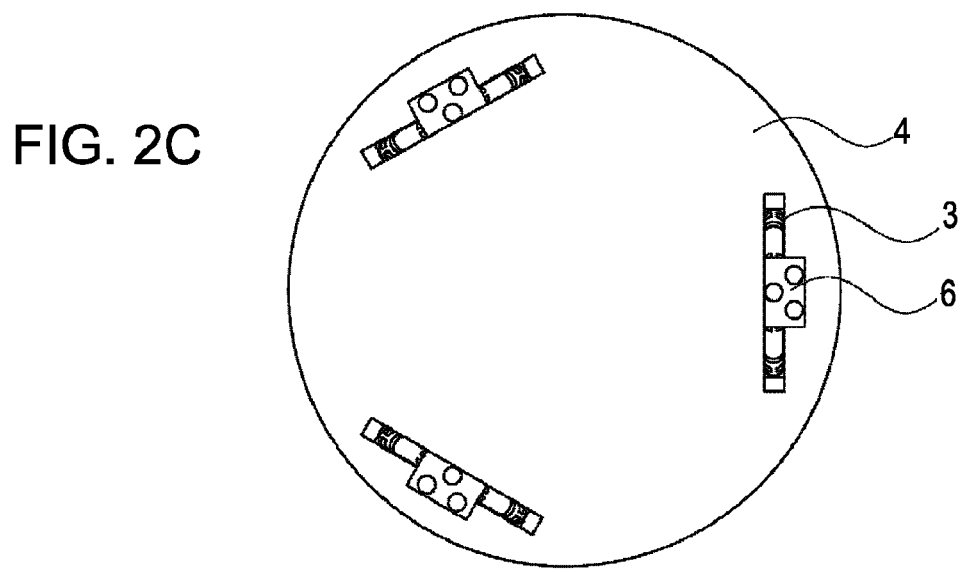

FIGS. 1 and 2A to 2C illustrate a holding apparatus according to a first embodiment of the present invention. In the figures, a light-axis direction is defined as the Z axis and two perpendicular directions in a plane perpendicular to the Z direction are defined as the X and Y directions. FIG. 1 is a perspective view of the holding apparatus. FIG. 2A is a side view of the holding apparatus in the state in which an object to be held is removed from a base. FIG. 2B illustrates the structure viewed in the direction denoted by IIB in FIG. 2A and FIG. 2C illustrates the structure viewed in the direction denoted by IIC in FIG. 2A.

In the present embodiment, an optical element 1 is described as an example of an object to be held. In the present embodiment, the optical element is a mirror. However, the optical element can also be, for example, a lens, a parallel plate glass, a prism, a Fresnel zone plate, a kinoform, a binary optics element, or a hologram. The present invention can also be applied to holding apparatuses for holding objects other than optical elements.

The holding apparatus 10 includes three holding units 7 at three positions along the outer periphery of the optical element 1. The holding units 7 can be disposed at constant angular intervals around a certain axis (for example, a light axis or optical axis). Each of the holding units 7 includes a kinematic coupling (kinematic mount) 2 and a flexure member 3, and the optical element 1 is supported on a base 4 by the kinematic coupling 2 and the flexure member 3 under the force of gravity.

Figure 3A:
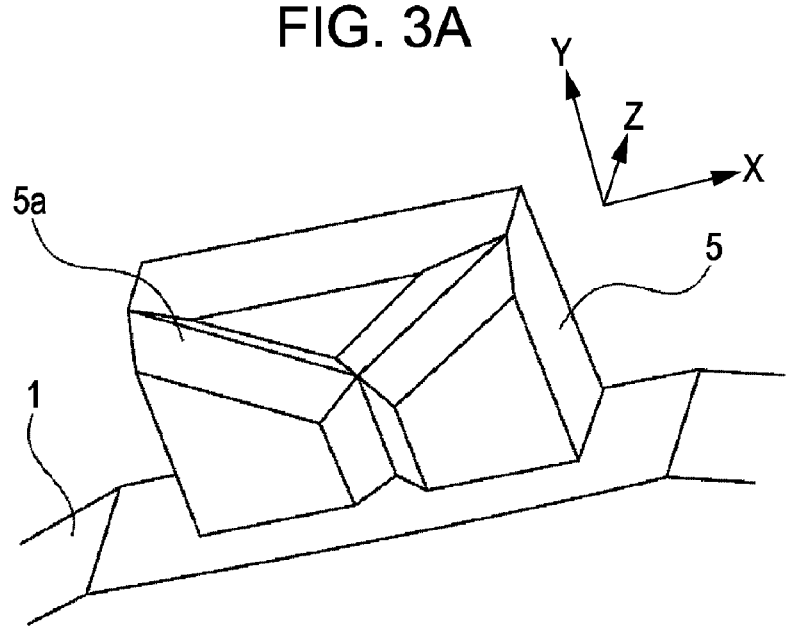
FIGS. 3A and 3B illustrate the detailed structure of a kinematic coupling.
Figure 3B:
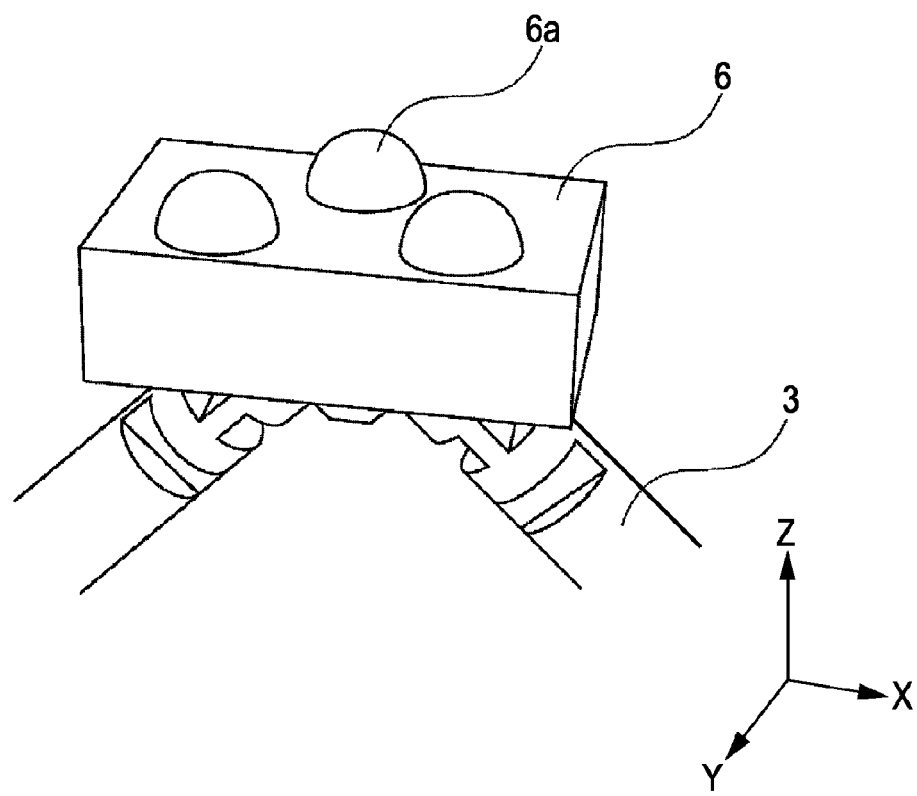

FIGS. 3A and 3B illustrate the detailed structure of each holding unit 7 in the first embodiment. The kinematic coupling 2 includes a held member 5 provided on the optical element 1 and a holding member 6 provided on the base 4 at a position corresponding to the held member 5. The holding member 6 is supported above the base 4 by the flexure member (a resilient or elastic member) 3. The kinematic coupling 2 includes three spherical elements 6a provided on the holding member 6 and three V-grooves formed in the held member 5. The V-grooves extend radially from a predetermined central point, and are arranged with constant angular intervals around an axis passing through the central point (central axis) that is parallel to the Z axis. The spherical elements 6a are disposed at constant angular intervals around the central axis. Surfaces (contact portions) of the V-grooves come into contact with the respective spherical elements, so that the held member 5 is kinematically held by the holding member 6. As a modification, the spherical elements can be provided on the held member 5, while the V-grooves are formed in the holding member 6. In other words, one of the held member 5 and the holding member 6 is provided with a plurality of projections while the other is provided with V-grooves, and surfaces of the V-grooves come into contact with the respective projections so that the held member 5 can be held.

The state in which a member is "kinematically held" means that the member is supported in such a manner that the degrees of freedom (the number of free axes) of the member is 0 and the number of constrained axes is six (the X axis, the Y axis, the Z axis, and rotations ωx, ωy, and ωz around the respective axes). Accordingly, excessive constraint can be prevented and strain caused by holding the member can be reduced. In addition, the position repeatability can be improved if the member is removed and then reattached. In other words, the relative position of the held member 5 with respect to the holding member 6 is exclusively determined.

The structure for kinematically holding a member is not limited to the structure of the present embodiment, and any structure can be used as long as the above-described conditions regarding the degrees of freedom and the number of constrained axes can be satisfied. This will be further described below with reference to modifications of the kinematic coupling.

Portions of the V-grooves and the spherical elements that come into contact with each other preferably are made from materials having high Young's moduli. In addition, the portions that come into contact with each other can be subjected to surface treatment for facilitating the reattachment or reducing friction.

An angle between the two surfaces forming each V-groove can be 90° or an angle in the range of 60° to 120°. If, for example, the rigidity in the X and Y directions is to be prioritized over the rigidity in the Z direction, the angle between the two surfaces can be set to an angle smaller than 90°.

The flexure member 3 can be an elastic hinge or one or more leaf springs, and is resiliently deformable in the radial direction of the optical element 1. Since the support structure is flexible in the radial direction, the optical element 1 is prevented from receiving a force when the base 4 is deformed. In other words, disturbance in the force that is externally applied to the optical element 1 can be reduced. The flexure member 3 according to the present embodiment can also have ball joints that provide flexibility in the rotational directions around the X, Y, and Z axes in addition to the radial direction.

Although the structure in which the optical element 1 has a circular shape has been explained, the holding apparatus according to the present embodiment can also be used for holding an optical element having a shape other than circular. In such a case, the above-described radial direction can be read as a direction perpendicular to the peripheral direction of the optical element, a direction connecting the light axis of the optical element and a point on the outer periphery of the optical element, or a direction connecting the center of gravity of the optical element and a point on the outer periphery of the optical element.

Next, the surface shape of the optical element 1 in the case in which the optical element 1 is removed and then reattached will be described.

FIGS. 4A to 4C show the structure according to the present embodiment, and FIGS. 5A to 5C and 6A to 6C show structures to which the present embodiment is not applied for comparison.

Figure 5A:
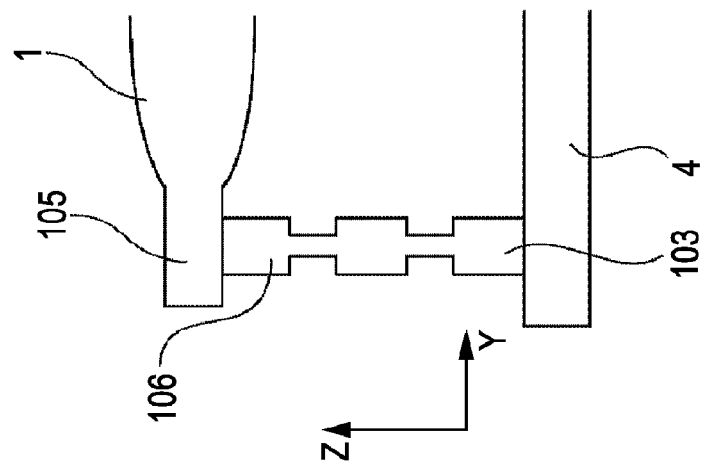
FIGS. 5A, 5B, and 5C illustrate the position repeatability obtained by surface fastening.
Figure 5B:
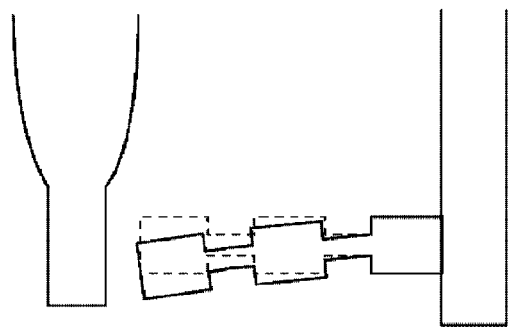
Figure 5C:
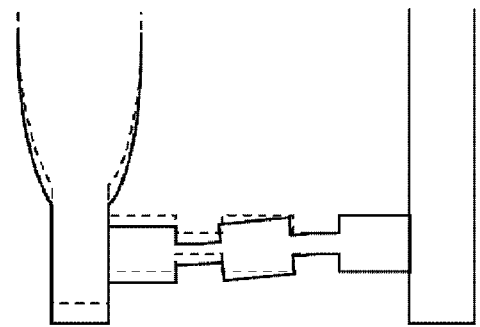

First, the structure to which the present embodiment is not applied will be described. FIGS. 5A to 5C show an example in which a held member 105 connected to the optical element 1 and a holding member 106 connected to the base 4 by a flexure member 103 are in surface-contact with each other.

FIG. 5A shows the state before the optical element 1 is removed, FIG. 5B shows the state after the optical element 1 is removed, and FIG. 5C shows the state after the optical element 1 is reattached. In FIGS. 5B and 5C, dashed lines shows the original position shown in FIG. 5A.

When the optical element 1 in the state shown in FIG. 5A is removed, the flexure member 103 becomes tilted, as shown in FIG. 5B. This is because the flexure member 103 has a manufacturing error that is canceled by attaching the flexure member 103 in a bent state. Then, when the optical element 1 is reattached, as shown in FIG. 5C, the optical element 1 is attached at a position different from the position shown in FIG. 5A. This is because the friction at the attachment surfaces and the dynamic state of sliding cannot be repeated, and the manner in which the flexure member 103 is bent changes each time the optical element 1 is removed and reattached.

When the flexure member 103, which functions as a spring, is bent, the optical element 1 receives a reactive force and the surface shape thereof changes. Therefore, variation in the manner in which the flexure member 103 is bent leads to a reduction in the repeatability of the surface shape.

Next, referring to FIGS. 6A to 6C, another structure to which the present embodiment is not applied will be described. FIGS. 6A to 6C show an example in which a held member 205 connected to the optical element 1 has a single V-groove, and a holding member 206 connected to the base 4 by a flexure member 203 has a single spherical element. The optical element 1 is supported by bringing the spherical element into contact with surfaces forming the V-groove. Unlike the present embodiment, each of three holding units disposed at three positions regulates the position of the optical element 1 in two axial directions. More specifically, the optical element 1 is kinematically supported by the three holding units.

FIG. 6A shows the state before the optical element 1 is removed, FIG. 6B shows the state after the optical element 1 is removed, and FIG. 6C shows the state after the optical element 1 is reattached. In FIGS. 6B and 6C, dashed lines shows the original position shown in FIG. 6A.

Similar to the case shown in FIGS. 5A to 5C, when the optical element 1 in the state shown in FIG. 6A is removed, the flexure member 203 is bent as shown in FIG. 6B. Then, when the optical element 1 is reattached, as shown in FIG. 6C, the optical element 1 is attached at a position different from the position shown in FIG. 6A. More specifically, the spherical element can move relative to the V-groove in a direction along the V-groove, and is also rotatable around the central axis of the spherical element. Therefore, similar to the case shown in FIGS. 5A to 5C, the manner in which the flexure member 203 is bent varies.

In comparison, the case in which the structure of the present embodiment is used will be described with reference to FIGS. 4A to 4C.

FIG. 4A shows the state before the optical element 1 is removed, FIG. 4B shows the state after the optical element 1 is removed, and FIG. 4C shows the state after the optical element 1 is reattached. In FIGS. 4B and 4C, dashed lines shows the original position shown in FIG. 4A.

When the optical element 1 in the state shown in FIG. 4A is removed, the flexure member 3 becomes tilted, as shown in FIG. 4B. Then, when the optical element 1 is reattached, as shown in FIG. 4C, the optical element 1 is held at substantially the same position as the position shown in FIG. 4A. More specifically, the manner in which the flexure member 3 is bent does not largely vary when the optical element 1 is removed and reattached, and therefore the repeatability of the surface shape of the optical element 1 is improved.

As described above, according to the present embodiment, each of the three holding units 7 disposed at three positions kinematically holds a respective held member of the optical element 1. In the structure shown in FIGS. 6A to 6C, each of the holding units regulates the position of the optical element 1 in two axial directions, so that the position of the optical element 1 is regulated in six axial directions as a whole. In comparison, according to the present embodiment, each of the holding units 7 regulates the position of each held member of the optical element 1 in six axial directions, so that the position of the optical element 1 is regulated in 18 axial directions as a whole.

According to the present embodiment, although the optical element 1 is excessively constrained, the repeatability of the surface shape of the optical element 1 when the optical element 1 is removed and reattached can be improved.

Modifications of the present embodiment will now be described. In each modification, structures that are not particularly explained are similar to those in the first embodiment.

First Modification

Figure 7A:
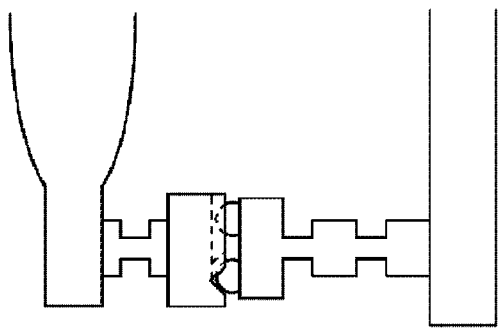
FIGS. 7A, 7B, and 7C illustrate the position repeatability obtained by a first modification of the first embodiment.
Figure 7B:
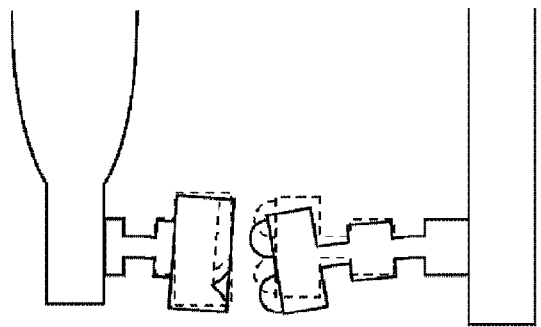
Figure 7C:
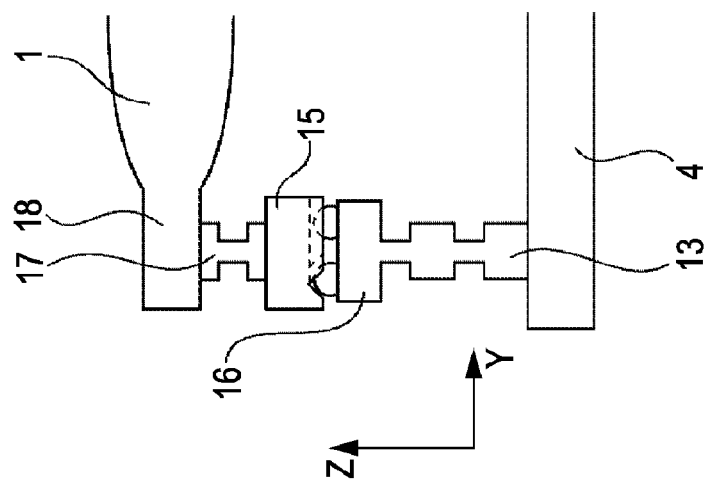

A first modification of the first embodiment will now be described. FIGS. 7A to 7C show an example in which a holding member 16 is supported above the base 4 by a flexure member 13, and another holding member 15 is connected to the optical element 1 by another flexure member 17. Although the flexure member 13 is formed integrally with the holding member 16 in FIGS. 7A to 7C, they can also be formed separately from each other. FIG. 7A shows the state before the optical element 1 is removed, FIG. 7B shows the state after the optical element 1 is removed, and FIG. 7C shows the state after the optical element 1 is reattached. Similar to the first embodiment shown in FIGS. 4A to 4C, in FIG. 7C, the optical element 1 is held at substantially the same position as the position shown in FIG. 7A. The manner in which the flexure members 13 and 17 are bent does not largely vary when the optical element 1 is removed and reattached, and therefore the repeatability of the surface shape of the optical element 1 is improved. In this modification, the holding members 15 function as held members.

Second Modification

Figure 8:
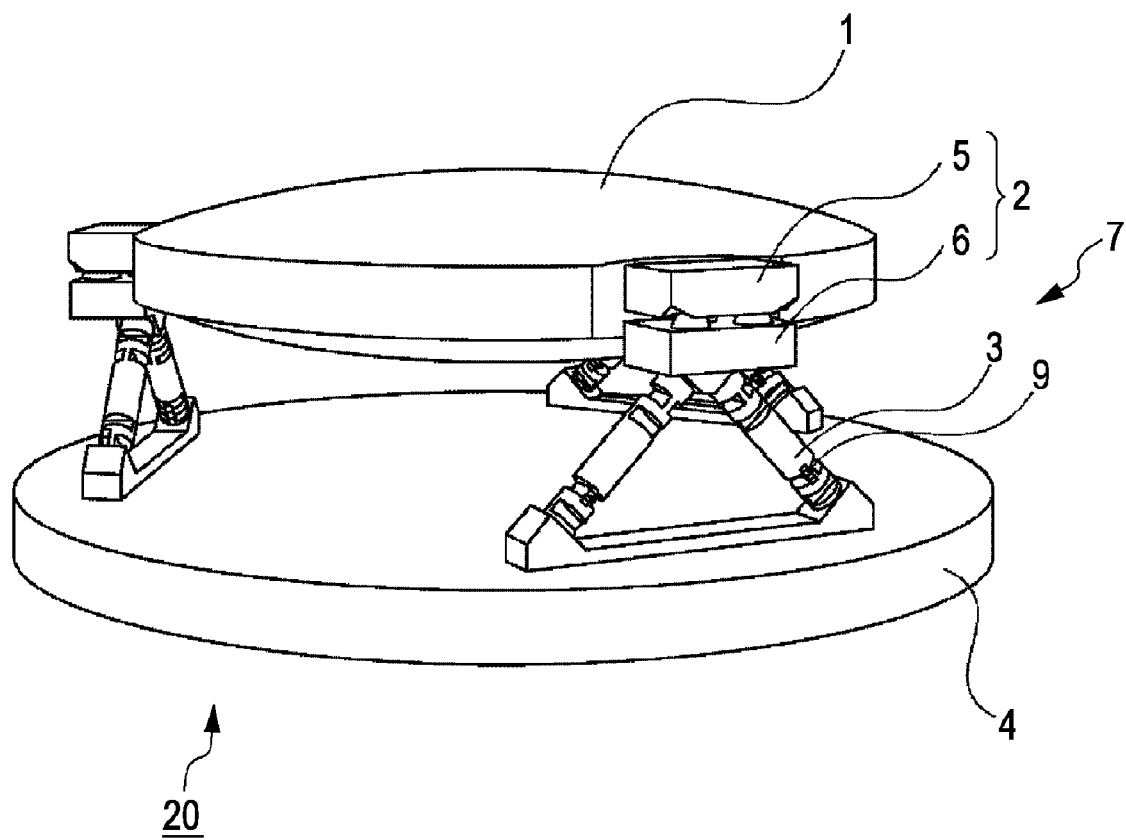
FIG. 8 is a perspective view of a holding apparatus according to a second modification of the first embodiment.

A second modification of the first embodiment will be described with reference to FIG. 8. In the second modification, each flexure member 3 includes an elastic hinge that is provided with an actuator 9. The actuator 9 is used for elastically deforming the flexure member 3 and for changing the position (including orientation) of the optical element 1. The actuator 9 can be a piezoelectric actuator. Alternatively, the actuator 9 can also be a controllable actuator, such as an inchworm actuator, an electromagnetic actuator, or a hydraulic actuator.

In addition to changing the position of the optical element 1, the actuator 9 can also be used for intentionally deforming the optical element 1 as necessary.

Third Modification

Figure 9:
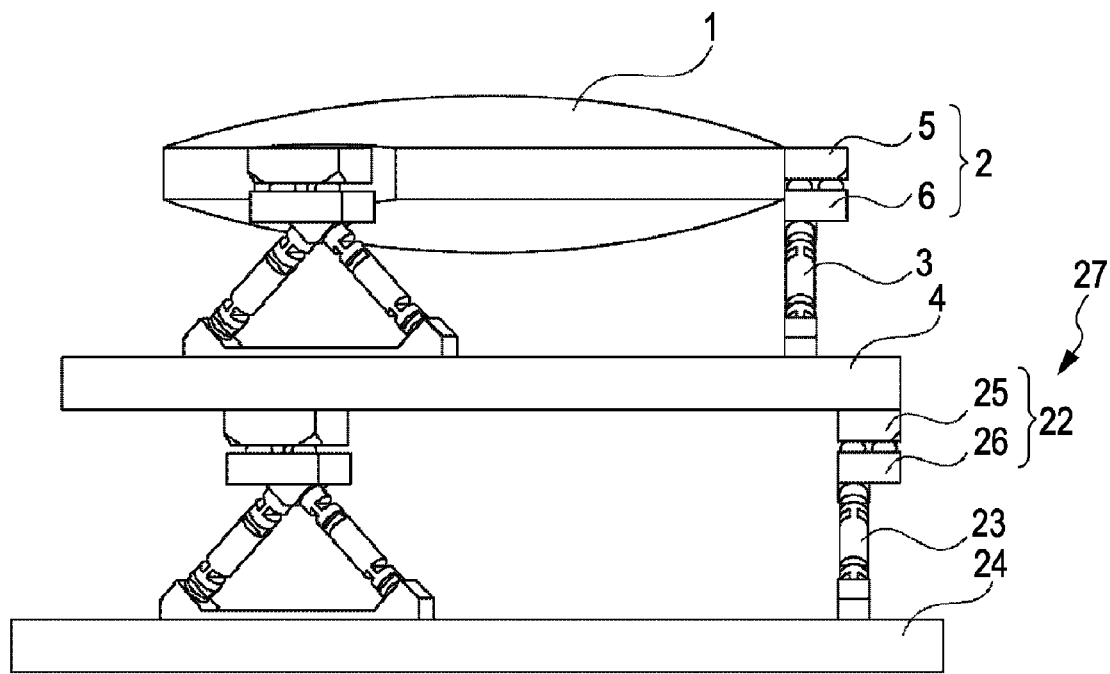
FIG. 9 is a perspective view of a holding apparatus according to a third modification of the first embodiment.

A third modification of the first embodiment will be described with reference to FIG. 9. In the third modification, the base 4 of the holding apparatus 10 according to the first embodiment is held by three second holding units 27. The three second holding units 27 are disposed at three positions along the outer periphery of the base 4. Each of the second holding units 27 includes a kinematic coupling 22 and a flexure member 23, and the optical element 1 is supported on a second base 24 by the kinematic coupling 22 and the flexure member 23. Each of the second holding units 27 also includes a held member 25 that is connected to the base 4 and a holding member 26 supported on the second base 24. The kinematic coupling 22 includes the held member 25 and the held member 26. The detailed structure of each holding unit 27 is similar to that of each holding unit 7, and the modification of the holding unit 7 can also be applied to the holding unit 27. Therefore, explanations of the holding units 27 are omitted here.

According to the third modification, the optical element 1 can not only be simply removed, but can be removed together with the base 4. Therefore, the freedom of maintenance can be increased. For example, sensors (not shown) for measuring the position and surface shape of the optical element 1 can be disposed on the base 4. According to the present modification, the sensors can also be removed and reattached in the maintenance process, and the shape of the base 4 can be prevented from being changed after the maintenance. Therefore, error factors of the sensors can be reduced.

Fourth Modification

Figure 10:
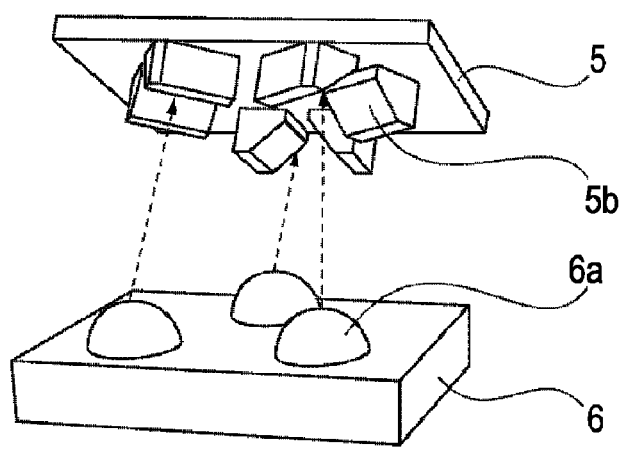
FIG. 10 illustrates a kinematic coupling according to a fourth modification of the first embodiment.

A fourth modification of the first embodiment will be described with reference to FIG. 10. In the fourth modification, the shape of the kinematic coupling is different from that in the first embodiment. More specifically, members 5b are arranged such that pairs of flat surfaces forming a substantially V-shaped projecting portion can be provided, without forming V-grooves in the held member 5 as shown in FIG. 3. In the present modification, six members 5b are provided to form three V-shaped portions. Each of the members 5b has a polygonal prismatic shape. The spherical elements 6a are similar to those described in the first embodiment, and the positional relationship between the V-shaped portions and the spherical elements 6a is also similar to that in the first embodiment.

Fifth Modification

Figure 11:
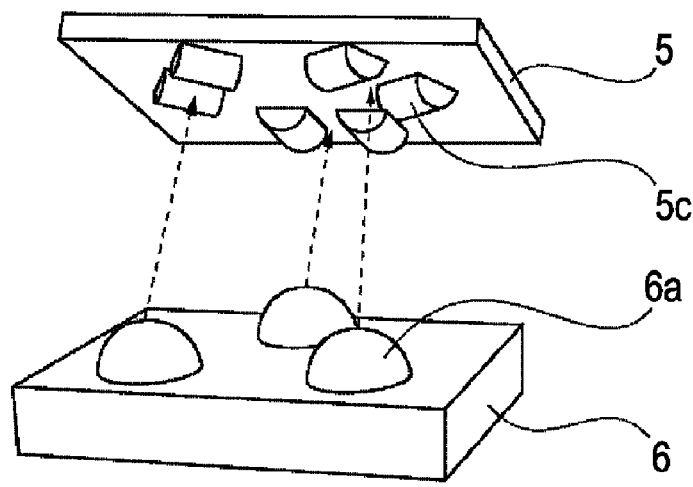
FIG. 11 illustrates a kinematic coupling according to a fifth modification of the first embodiment.

A fifth modification of the first embodiment will be described with reference to FIG. 11. In the fifth modification, the shape of the kinematic coupling is again different from that in the first embodiment. The held member 5 is provided with convex cylindrical members 5c, each of which is shaped like a portion of a circular column. Three pairs of members 5c are provided, each pair including two members 5c that are parallel to each other and are arranged line-symmetrically about a certain axis. A perpendicular line extending from an intersection point of the three symmetry axes of the three pairs of members 5c can substantially pass through the median of a triangle connecting the centers of three spherical elements 6a. In addition, of the three symmetry axes, the adjacent symmetry axes can form an angle of approximately 120°.

Sixth Modification

Figure 12:
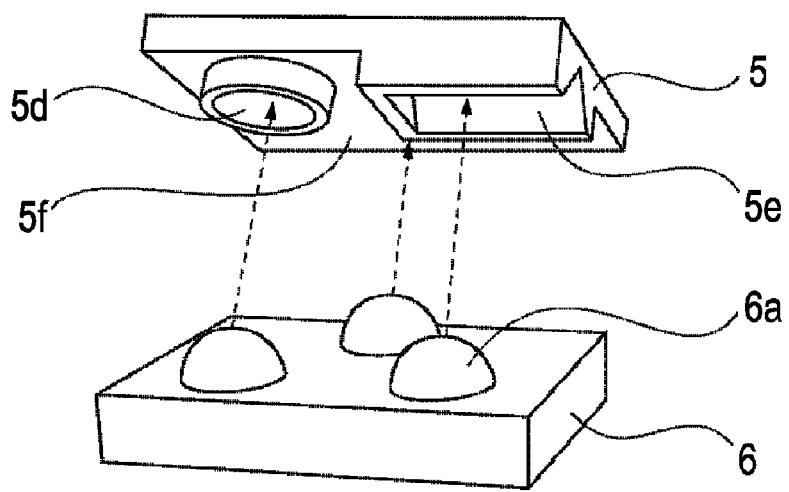
FIG. 12 illustrates a kinematic coupling according to a sixth modification of the first embodiment.

A sixth modification of the first embodiment will be described with reference to FIG. 12. In the sixth modification, the shape of the kinematic coupling is again different from that in the first embodiment. The held member 5 has a conical recess 5d, a V-groove 5e, and a flat surface 5f. The spherical elements 6a are similar to those in the first embodiment.

One of the spherical elements 6a is brought into contact with an inner surface of the recess 5d, so that the position of the held member 5 is regulated with respect to the holding member 6 in three axis directions. In addition, another one of the spherical elements 6a is brought into contact with flat surfaces of the V-groove 5e, so that the position of the held member 5 is regulated with respect to the holding member 6 in two rotational directions. In addition, the other one of the spherical elements 6a is brought into contact with the flat surface 5f, so that the position of the held member 5 is regulated with respect to the holding member 6 in one rotational direction. Each direction is independent, and thus the held member 5 is kinetically held with respect to the holding member 6.

Seventh Modification

Figure 13:
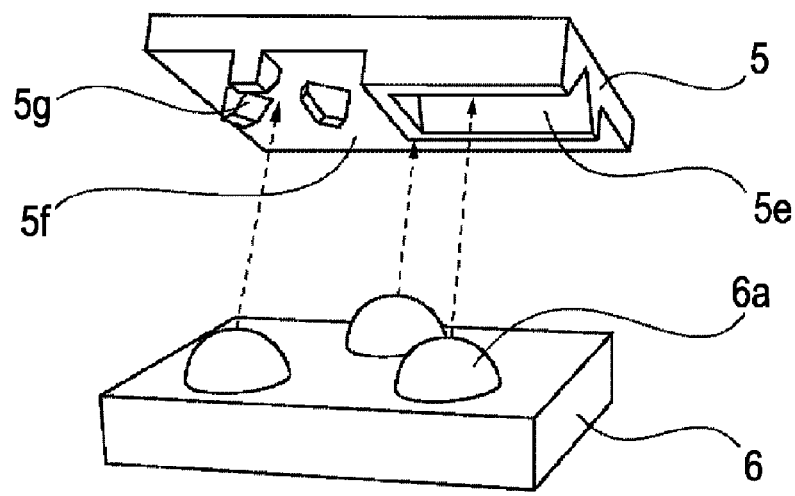
FIG. 13 illustrates a kinematic coupling according to a seventh modification of the first embodiment.

A seventh modification of the first embodiment will be described with reference to FIG. 13. In the seventh modification, the shape of the kinematic coupling is different from that in the first embodiment.

The held member 5 is provided with three projections 5g, a V-groove 5e, and a flat surface 5f. The holding member 6 has three spherical elements 6a. The three projections 5g are arranged such that they are rotationally symmetrical to each other about a certain axis, and such that an extension of the V-groove 5e passes through this axis. In addition, each of the three projections 5g has a flat surface that comes into contact with one of the spherical elements 6a, and the three flat surfaces of the three projections 5g form a virtual cone or a portion of a regular tetrahedron.

Eighth Modification

Figure 14:
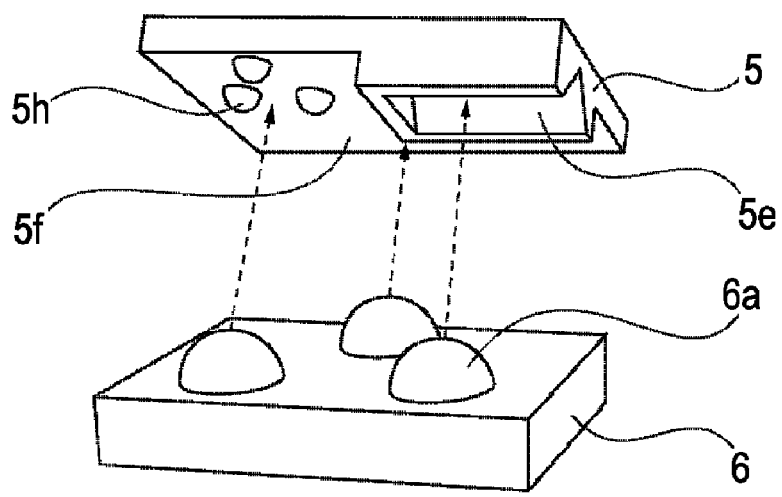
FIG. 14 illustrates a kinematic coupling according to an eighth modification of the first embodiment.

An eighth modification of the first embodiment will be described with reference to FIG. 14. In the eighth modification, the shape of the kinematic coupling is once again different from that in the first embodiment. The held member 5 is provided with three spherical elements 5h, a V-groove 5e, and a flat surface 5f. The spherical elements 5h and the V-groove 5e are arranged such that an extension of the V-groove 5e passes through the median of a triangle connecting the centers of the spherical elements 5h.

Ninth Modification

Figure 15:
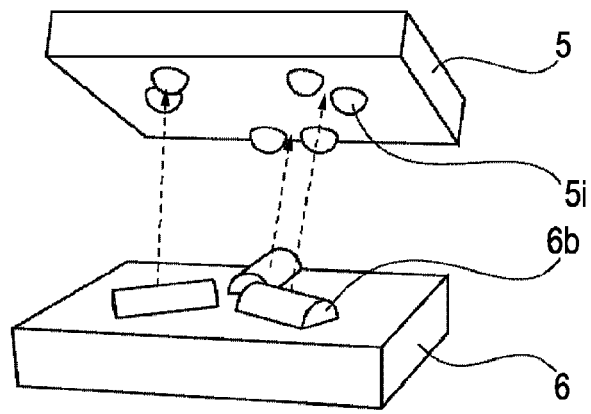
FIG. 15 illustrates a kinematic coupling according to a ninth modification of the first embodiment.

A ninth modification of the first embodiment will be described with reference to FIG. 15. In the ninth modification, the shape of the kinematic coupling is different from that in the first embodiment. The held member 5 is provided with a plurality of spherical elements 5i. The holding member 6 is provided with three columnar members 6b, each of which is shaped like a portion of a cylinder. Three pairs of spherical elements 5i are provided, each pair including two spherical elements 5i that are arranged symmetrical to each other about the central axis of the corresponding cylindrical member 6b. The central axes of the adjacent cylindrical members 6b can form an angle of approximately 120°.

Second Embodiment

Figure 16:
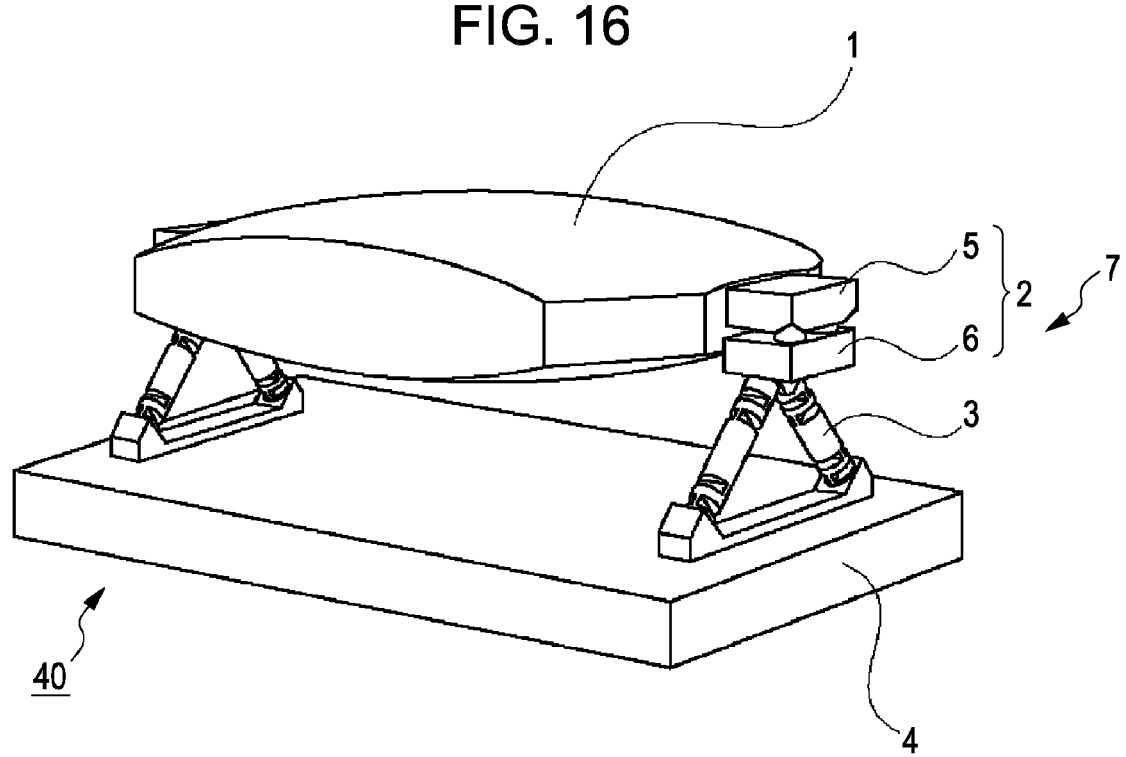
FIG. 16 is a perspective view of an optical-element holding apparatus according to a second embodiment.
Figure 17A:
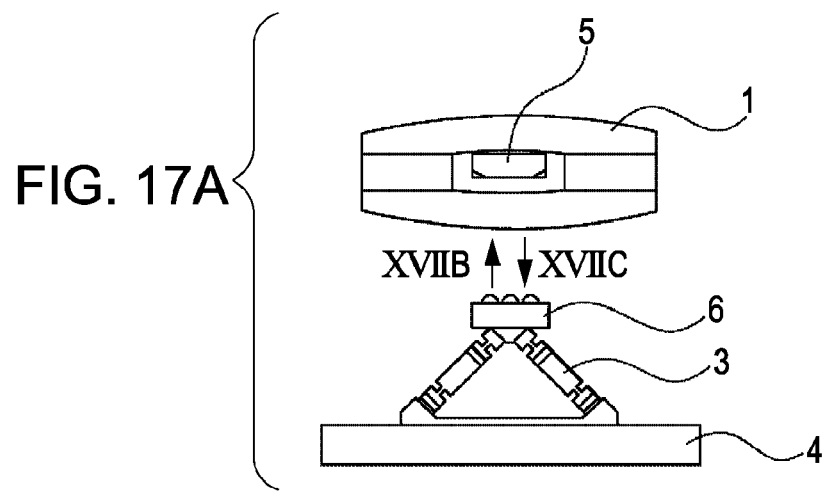
FIG. 17A is a side view of the optical-element holding apparatus according to the second embodiment.
Figure 17B:
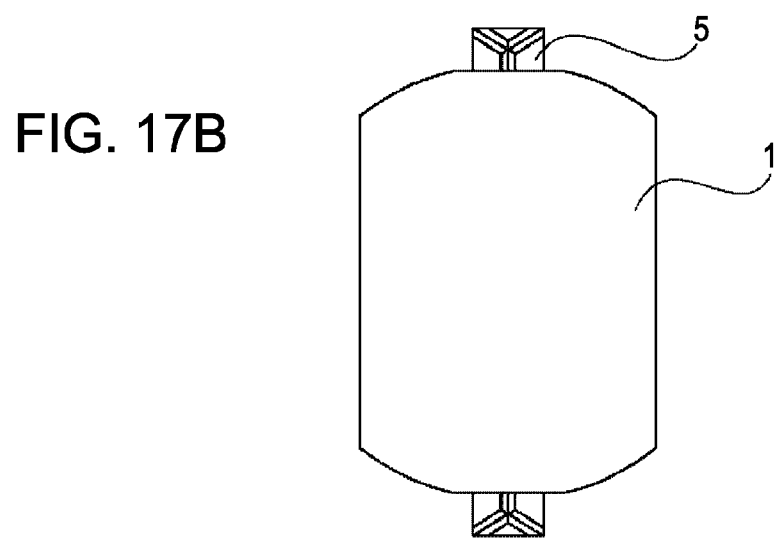
FIGS. 17B and 17C are plan views of the optical-element holding apparatus according to the second embodiment.
Figure 17C:
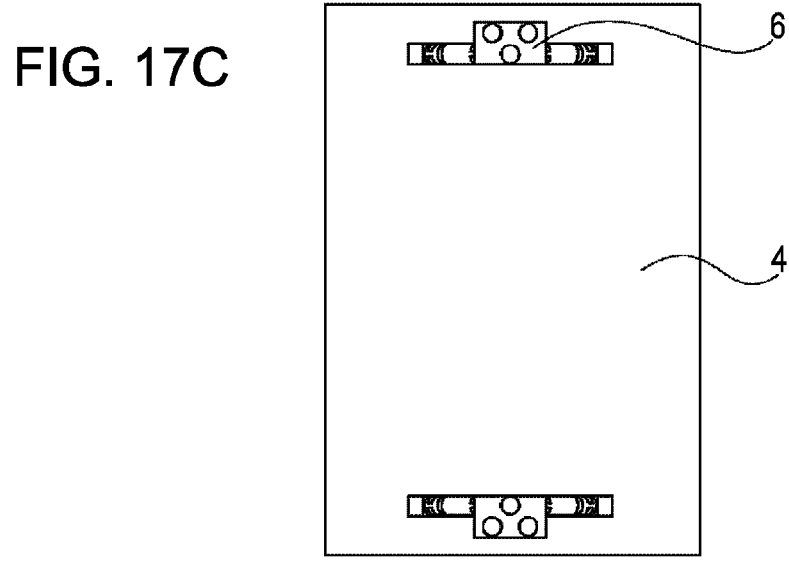

FIGS. 16 and 17A to 17C illustrate a holding apparatus 40 according to a second embodiment. FIG. 16 is a perspective view of the holding apparatus 40. FIG. 17A is a side view of the holding apparatus 40 in the state in which an object to be held is removed from a base. FIG. 17B illustrates the structure viewed in the direction denoted by XVIIB in FIG. 17A and FIG. 17C illustrates the structure viewed in the direction denoted by XVIIC in FIG. 17A.

The holding apparatus 40 includes two holding units 7 at two positions along the periphery of the optical element 1. Each of the holding units 7 includes a kinematic coupling 2 and a flexure member 3, and the optical element 1 is connected to the base 4 by the kinematic coupling 2 and the flexure member 3. The structure of each holding unit 7 is similar to that according to the first embodiment, and first to ninth modifications of the first embodiment can also be applied to the second embodiment.

The holding units 7 can be arranged symmetrically with respect to a plane passing though the center of gravity of the optical element 1 or a plane passing through the light axis of the optical element 1.

Alternatively, the optical element 1 can also be held at three positions, and the holding units 7 can be placed at two of the three positions.

Application to Exposure Apparatus

Figure 18:
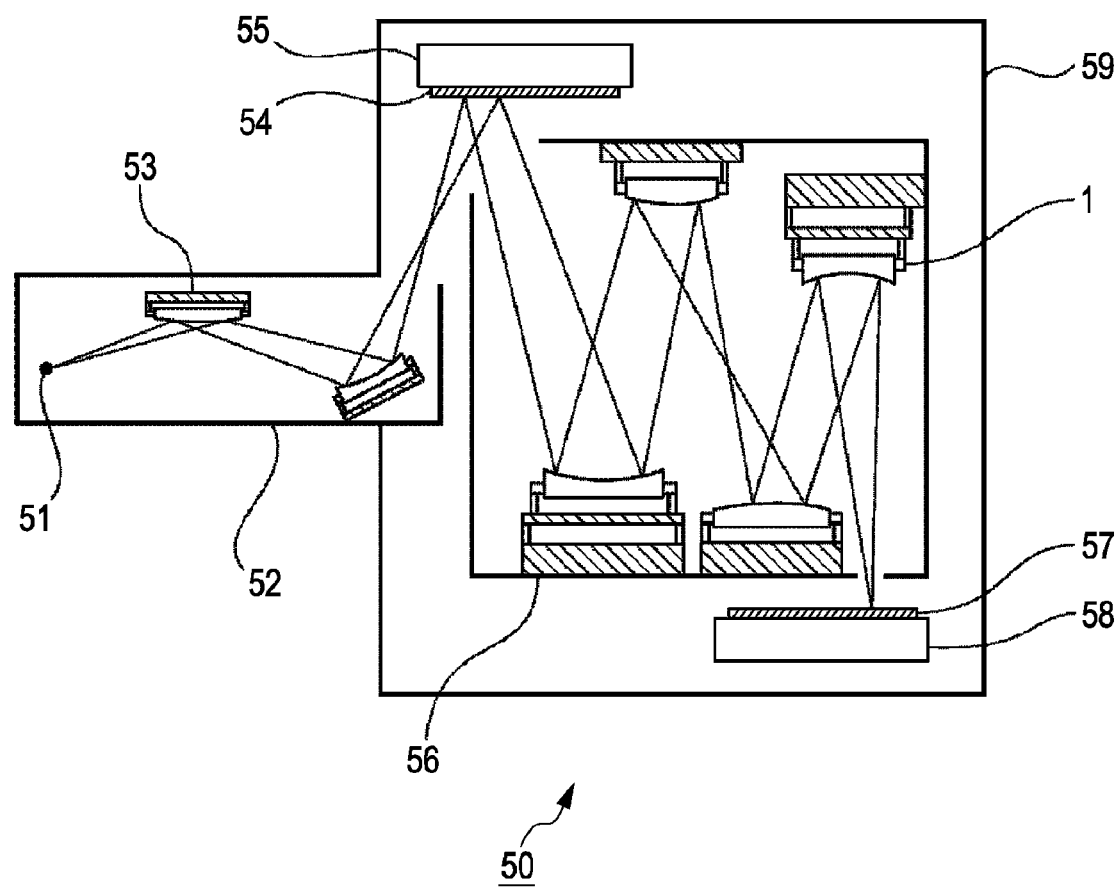
FIG. 18 illustrates an exposure apparatus in which an optical-element holding apparatus according to the present invention is used.

FIG. 18 is a schematic diagram of an exposure apparatus 50. Referring to the figure, the exposure apparatus 50 includes a light-emitting portion 51 that emits extreme ultraviolet (EUV) light, an illumination optical system 52 that guides the emitted light to a reticle 54, and a projection optical system 56 for projecting light reflected by the reticle (original) 54 onto a wafer (substrate) 57. The exposure apparatus 50 also includes a reticle stage 55 for moving the reticle 54 and a wafer stage 58 for moving the wafer 57.

The holding apparatuses according to the above-described embodiments are suitable for use as a holding apparatus for holding at least one of the optical elements included in the illumination optical system 52, the projection optical system 56, or other optical systems. The structure of the exposure apparatus to which the holding apparatuses according to the above-described embodiments can be applied is not limited to the structure shown in FIG. 18.

Example of Device Manufacturing Method

Figure 19:
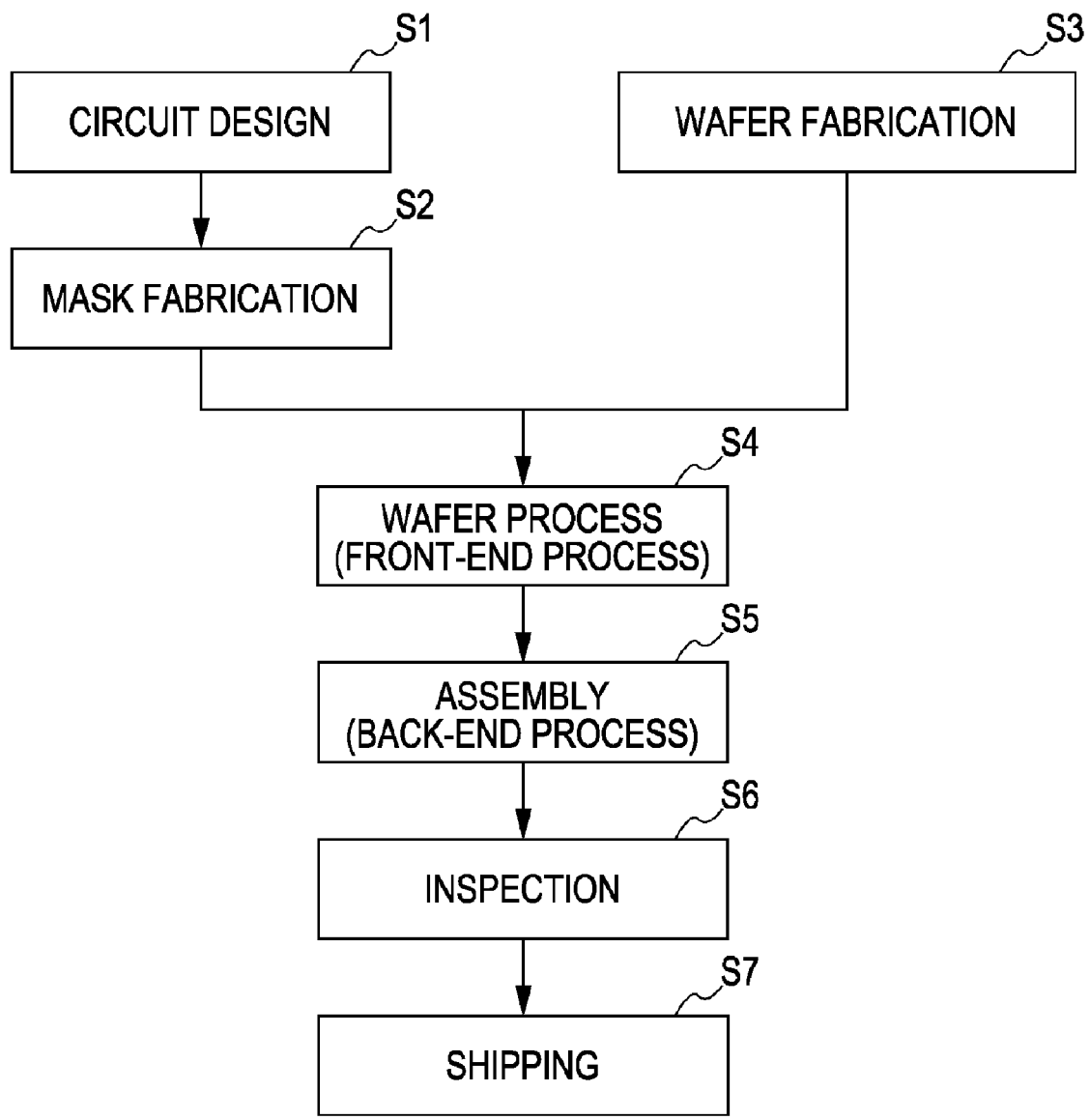
FIG. 19 is a flowchart of a device manufacturing process using the exposure apparatus.

An example of a device manufacturing method using the above-described exposure apparatus will now be described with reference to FIGS. 19 and 20. FIG. 19 is a flowchart showing processes for manufacturing devices (for example, semiconductor chips such as ICs and LSIs, LCDs, and CCDs). In this example, a manufacturing method of semiconductor chips will be described.

In Step S1 (circuit design), a circuit of semiconductor devices is designed. In Step S2 (mask fabrication), a mask is fabricated in the designed circuit pattern. In Step S3 (wafer fabrication), a wafer is formed of a material such as silicon. In Step S4 (wafer process), called a front-end process, actual circuits are formed on the wafer by oxidation, deposition, etching etc. and lithography with the mask and the wafer using the exposure apparatus. In Step S5 (assembly), called a back-end process, semiconductor chips are formed from the wafer obtained in Step S4. This process includes an assembly process (dicing and bonding) and a packaging process (chip sealing). In Step S6 (inspection), the semiconductor devices obtained in Step S5 are tested for, for example, operation and durability. The semiconductor chips are thus completed through the above processes, and are then shipped (Step S7).

Figure 20:
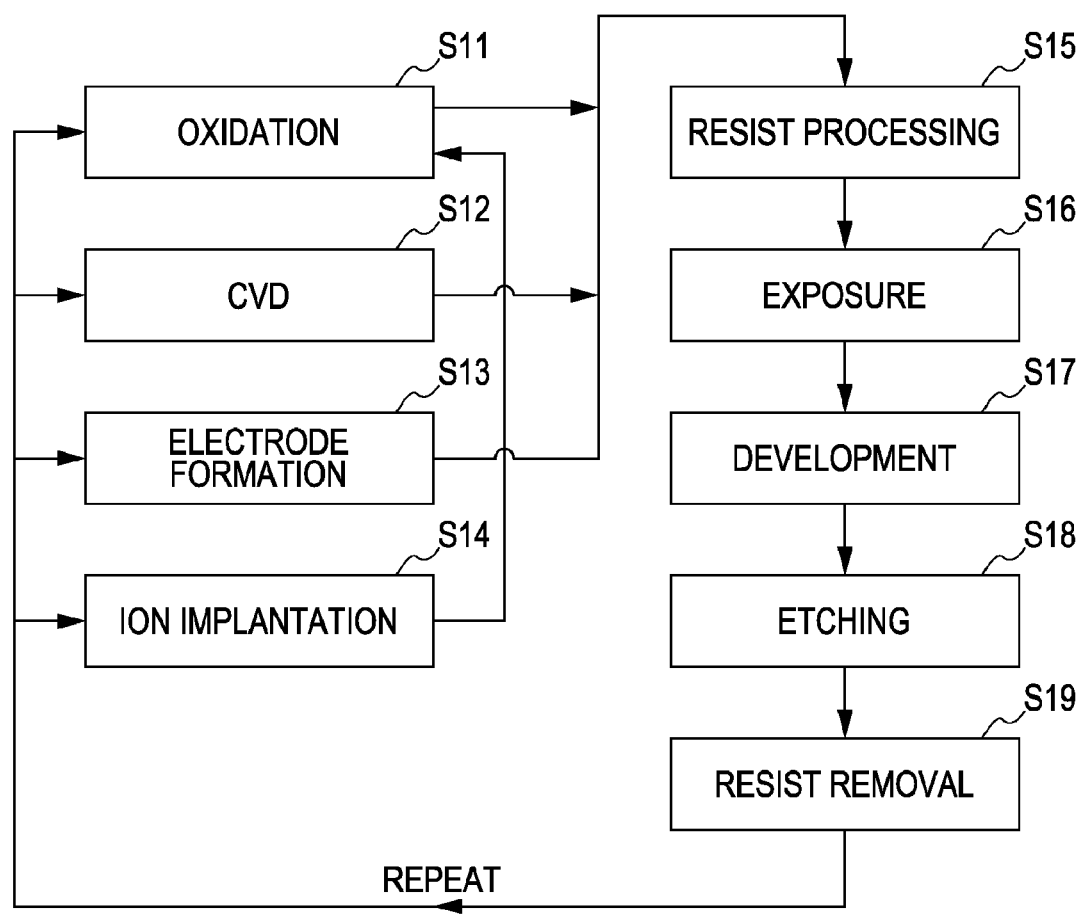
FIG. 20 is a flowchart of a wafer process in step 4 of the flowchart shown in FIG. 19.
Figure 21:
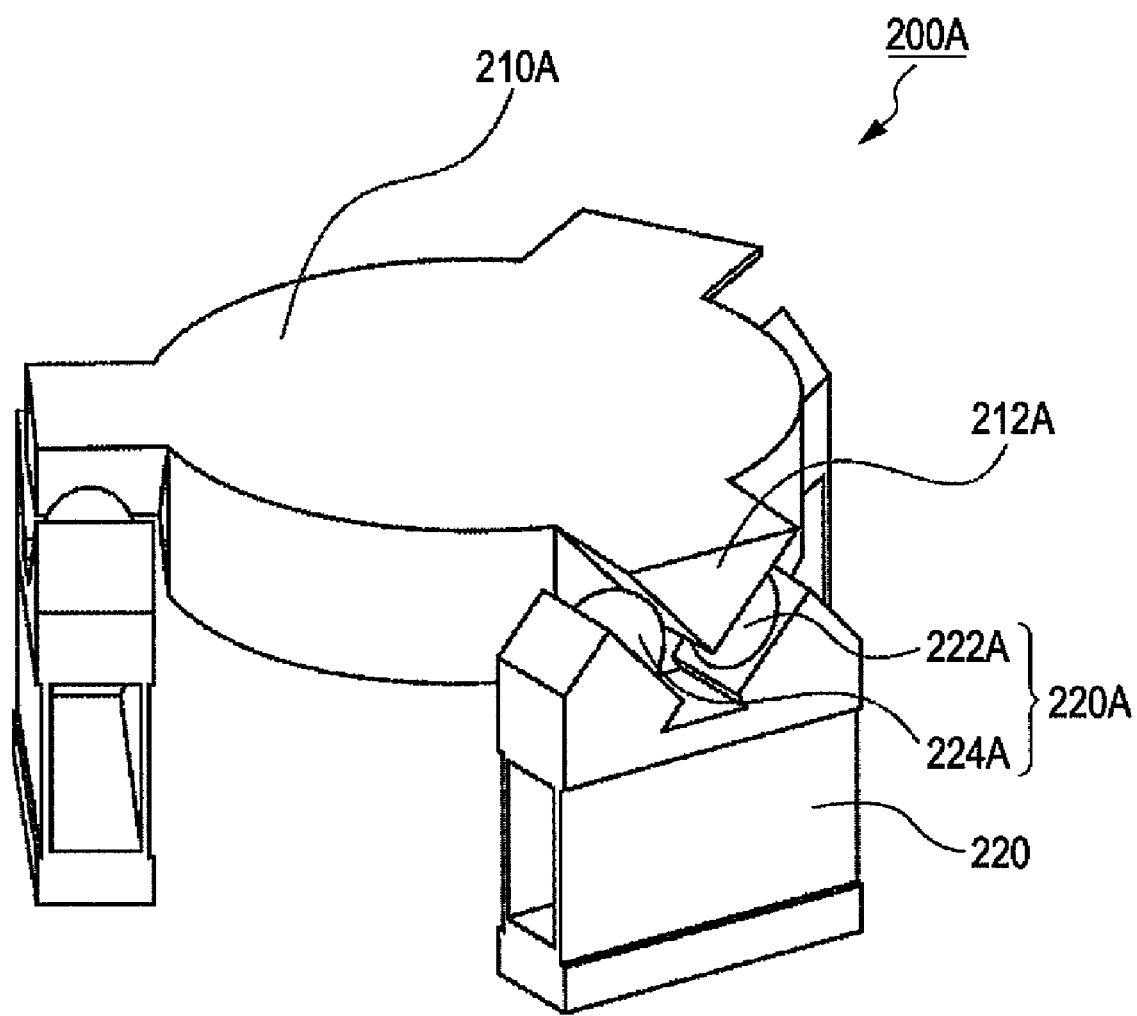
FIG. 21 illustrates a conventional holding apparatus described in Japanese Patent Laid-Open No. 2004-078209.

FIG. 20 is a detailed flowchart of the wafer process performed in Step S4 shown in FIG. 19. In Step S11 (oxidation), the surface of the wafer is oxidized. In Step S12 (CVD), an insulating film is formed on the surface of the wafer. In Step S13 (electrode formation), electrodes are formed on the wafer by deposition. In Step S14 (ion implantation), ions are implanted into the wafer. In Step S15 (resist processing), a photosensitive agent is applied to the wafer. In Step S16 (exposure), the circuit pattern of the mask is projected onto the wafer by the exposure apparatus. In Step S17 (development), the exposed wafer is developed. In Step S18 (etching), parts other than the developed resist image are etched away. In Step S19 (resist removal), the resist, which becomes unnecessary after etching, is removed. By repeating these steps, a multi-layer circuit pattern is formed on the wafer.

According to the present invention, changes in the surface shape of the optical element that occur when the optical element is removed and reattached can be reduced.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Application No. 2007-044006 filed Feb. 23, 2007, which is hereby incorporated by reference herein in its entirety.

What is claimed is:

1. A holding apparatus adapted to hold an optical element above a base, the holding apparatus comprising:
   at least two held members provided at different positions on an outer periphery of the optical element; and
   holding members corresponding respectively to the held members, the holding members being supported above the base by flexure members,
   wherein the at least two held members are held by the holding members to form a plurality of kinematic couplings that regulates a position of the optical element in at least twelve axial directions as a whole, wherein each kinematic coupling includes a held member and a holding member and is configured to regulate a position of the held member in six axial directions, and wherein the optical element is removable from the base by removing the plurality of kinematic couplings.

2. The holding apparatus according to claim 1, wherein each held member is in surface-contact with the corresponding holding member at six positions, normal vectors of surfaces at which the held member is in surface-contact with the holding member being independent from each other.

3. The holding apparatus according to claim 1, wherein each of the kinematic couplings includes a plurality of spherical projections provided on one of the corresponding held member and the corresponding holding member, and
   wherein each held member is held by the corresponding holding member such that the held member is in contact with the holding member at the plurality of spherical projections.

4. The holding apparatus according to claim 1, wherein each of the kinematic couplings includes a spherical member placed between the corresponding held member and the corresponding holding member, and
   wherein each held member is held by the corresponding holding member such that the held member and the holding member are both in contact with the spherical member.

5. A holding apparatus that holds an optical element above a base, the holding apparatus comprising:
   at least two held members provided at different positions on an outer periphery of the optical element; and
   holding members provided above the base for the respective held members, the holding members being supported above the base by leaf springs,
   wherein the at least two held members are held by the holding members to form a plurality of kinematic couplings that regulates a position of the optical element in at least twelve axial directions as a whole, wherein each kinematic coupling includes a held member and a holding member and is configured to regulate a position of the held member in six axial directions, and wherein the optical element is removable from the base by removing the plurality of kinematic couplings.

6. A holding apparatus that holds an optical element above a base, the holding apparatus comprising:
   at least two held members provided at different positions on an outer periphery of the optical element; and holding members provided above the base for the respective held members, the holding members being supported above the base by elastic hinges, wherein the at least two held members are held by the holding members in to form a plurality of kinematic couplings that regulates a position of the optical element in at least twelve axial directions as a whole, wherein each kinematic coupling includes a held member and a holding member and is configured to regulate a position of the held member in six axial directions, and wherein the optical element is removable from the base by removing the plurality of kinematic couplings.

7. The holding apparatus according to claim 6 in which an elastic hinge is provided with an actuator operable to change a shape of the elastic member.

8. An exposure apparatus for projecting a pattern of an original onto a substrate via one or more optical elements, the exposure apparatus including:

at least two held members provided at different positions on an outer periphery of the optical element; and holding members corresponding respectively to the held members, the holding members being supported above a base by flexure members, wherein the at least two held members are held by the holding members to form a plurality of kinematic couplings that regulates a position of the optical element in at least twelve axial directions as a whole, wherein each kinematic coupling includes a held member and a holding member and is configured to regulate a position of the held member in six axial directions, and wherein the optical element is removable from the base by removing the plurality of kinematic couplings.

9. A holding apparatus that holds an object above a base, the holding apparatus comprising:

at least two held members provided at different positions on an outer periphery of the object; and holding members corresponding respectively to the held members, the holding members being supported above the base by flexure members, wherein the at least two held members are held by the holding members to form a plurality of kinematic couplings that regulates a position of the optical element in at least twelve axial directions as a whole, wherein each kinematic coupling includes a held member and a holding member and is configured to regulate a position of the held member in six axial directions, and wherein the optical element is removable from the base by removing the plurality of kinematic couplings.

* * * * *